United States Patent
Kobayashi et al.

(10) Patent No.: US 7,438,776 B2
(45) Date of Patent: Oct. 21, 2008

(54) TAPE ADHERING METHOD AND TAPE ADHERING APPARATUS

(75) Inventors: Kazuo Kobayashi, Mitaka (JP); Minoru Ametani, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 611 days.

(21) Appl. No.: 11/090,626

(22) Filed: Mar. 24, 2005

(65) Prior Publication Data

US 2005/0282362 A1 Dec. 22, 2005

(30) Foreign Application Priority Data

Jun. 16, 2004 (JP) .............................. 2004-178411

(51) Int. Cl.
*B32B 41/00* (2006.01)

(52) U.S. Cl. .................. 156/64; 156/353; 156/360; 156/361

(58) Field of Classification Search .................. 156/64, 156/353, 358, 360, 361, 362, 363, 250, 267, 156/522, 523

See application file for complete search history.

(56) References Cited

U.S. PATENT DOCUMENTS

| | | | |
|---|---|---|---|
| 4,925,515 A | 5/1990 | Yoshimura et al. | |
| 5,961,768 A | 10/1999 | Tsujimoto | |
| 2003/0062116 A1 | 4/2003 | Lee | |
| 2003/0064592 A1 | 4/2003 | Yamamoto | |

FOREIGN PATENT DOCUMENTS

| | | |
|---|---|---|
| EP | 1 328 011 A2 | 7/2003 |
| EP | 1 381 076 A2 | 1/2004 |
| JP | 2002-134438 | 5/2002 |
| JP | 2002-222779 A | 8/2002 |

OTHER PUBLICATIONS

Translation of JP 2002-134438 (document filed and listed on Mar. 24, 2005 IDS).*
Patent Abstract of Japan, Publication No. 2002134438 A, Published on May 10, 2002, in the name of Tanigawa.

(Continued)

*Primary Examiner*—George R Koch, III
(74) *Attorney, Agent, or Firm*—Christie, Parker & Hale, LLP

(57) ABSTRACT

A method and an apparatus for adhering a tape (3) on a wafer (20) are disclosed. The wafer is supported on a table (31), and the tape is supplied, between a tape adhering surface (20') and a tape adhering unit (46), from a tape supply unit (42). The table is moved toward the tape adhering unit, whereby the tape adhering surface of the wafer on the table is pressed against the tape adhering unit through the tape with a force (F). Further, the tape adhering unit is moved from one end (28) to the other end (29) of the wafer in parallel to the tape adhering surface. The pressure (P) under which the tape adhering surface is in contact with the tape adhering unit through the tape is kept substantially uniform while the tape adhering unit moves from one end to the other end of the wafer. As a result, the pressure on the wafer is accurately equalized in spite of the movement of the tape adhering unit.

8 Claims, 11 Drawing Sheets

OTHER PUBLICATIONS

European Search Report for application No. 05251381.9, dated Jun. 14, 2006, in the name of Tokyo Seimitsu Co., Ltd.
Derwent Abstract corresponding to Publication No. JP2002-222779-A, dated Aug. 9, 2002, in the name of Moriya Kazuhiro.
Australian Examination/Search Report dated Jun. 16, 2006 for corresponding SG 200501479-0, in the name of Tokyo Seimitsu Co., Ltd.

* cited by examiner

TAPE ADHERING METHOD AND TAPE ADHERING APPARATUS

CROSS-REFERENCE TO RELATED APPLICATION

This application claims priority of Japanese Patent Application Number 2004-178411, filed on Jun. 16, 2004.

BACKGROUND OF THE INVENTION

1. Field of the Invention

The present invention relates to a tape adhering method, and to a tape adhering apparatus for carrying out the tape adhering method, which are used to adhere a tape such as a dicing tape on the back surface of a wafer or a surface protection tape on the front surface of the wafer.

2. Description of the Related Art

In the field of semiconductor production, the trend is toward an ever-increasing size of the wafer. On the other hand, the wafer is becoming thinner and thinner to increase the density. In order to reduce the thickness of the wafer, the back surface of the semiconductor wafer is ground. In the process, a surface protection tape is adhered on the front surface of the wafer to protect the semiconductor elements formed on the front surface of the wafer.

The wafer formed with semiconductor elements on the surface thereof is finally cut into cubes by a dicing machine. During the dicing process, the wafer is integrated with a frame by the dicing tape adhered to the back surface of the wafer. Then, the wafer is "half cut" to the intermediate part of the wafer by the dicing blade of the dicing machine, or the wafer is "full cut" completely while cutting to the intermediate part of the dicing tape. Before adhering the dicing tape on the back surface of the wafer, the die attach film tape (DAF tape) may be adhered on the back surface of the wafer. The DAF tape functions as an adhesive on the die bottom at the time of die bonding after dicing. Alternatively, a dicing tape having a die attach film (DAF) having substantially the same shape as the wafer may be used. Unless otherwise specified, the dicing tape described below also contains the die attach film.

Generally, the tape adhering apparatus used for adhering the surface protection tape or the dicing tape comprises an adsorption table for adsorbing the wafer and a roller adapted to move along the upper surface of the wafer adsorbed to the adsorption table. The tape to be adhered is supplied between the roller and the wafer. The roller is adapted to move in parallel along the upper surface of the wafer on the one hand and in the direction perpendicular to the upper surface of the wafer on the other hand. The adsorption table, on the other hand, is immobile and adsorbs the wafer.

FIG. 10a is a diagram showing the relation between the force exerted between the roller and the adsorption table (ordinate) and the distance of the roller from one end of the wafer (abscissa) in an ordinary tape adhering apparatus. FIG. 10b is a diagram showing the relation between the pressure applied to the wafer (ordinate) and the distance of the roller from one end of the wafer (abscissa) in FIG. 10a. In these drawings, the distance from one end of the wafer on the straight line passed through the center of the wafer is designated as x, and the radius of the wafer as r. As shown in FIG. 10a, the force $F(x)$ exerted between the roller and the adsorption table of an ordinary tape adhering apparatus is set substantially constant over the whole adhering process.

The wafer on which the surface protection tape or the dicing tape is adhered, i.e. the silicon wafer used for fabricating a semiconductor is normally circular in shape. The roller starts to contact the wafer at one end of the wafer and moves toward the other end. Normally, the pressure $P(x)$ exerted on the wafer is determined based on the roller located at the center of the wafer. In the case where the roller is located at about the center of the wafer (x=r), as shown in FIG. 10b, therefore, the desired pressure P1 is obtained. As the roller moves toward one end of the wafer, however, the pressure gradually increases and becomes almost infinitely large at the ends of the wafer (x=0 and x=2r). This is considered to be due to the fact that the wafer is circular in shape and therefore the area of the wafer in contact with the roller changes when the roller slides, i.e. the contact area is smaller at the ends and larger at the center of the wafer and the fact that the force exerted on the wafer is constant as shown in FIG. 10a.

An explanation is given for a case in which the pressure imparted when the surface protection tape or the dicing tape is adhered on the wafer changes as shown in FIG. 10b. FIG. 11a is a sectional view, taken along the direction in which the roller proceeds, with the surface protection tape 500 adhered on the surface 21 of the wafer 20 formed with a plurality of semiconductor devices 25 by an ordinary tape adhering apparatus. In similar fashion, FIG. 11b is a sectional view, taken along the direction in which the roller proceeds, with the dicing tape 51 adhered on the back surface 22 of the wafer 20 by an ordinary tape adhering apparatus. The dicing tape 51 contains the DAF 52. In these drawings, the roller (not shown) proceeds from a first end 28 to a second end 29 of the wafer 20. The surface protection tape 500 and the dicing tape 51 are comparatively soft. In the case where the pressure for adhering any of these tapes undergoes a change as shown in FIG. 10b, therefore, the portion of the tape under a high pressure is flattened. Specifically, as shown in FIGS. 11a and 11b, the surface protection tape 500 and the dicing tape 51 are thick at the center of the wafer 20 and tend to decrease in thickness at the ends 28, 29 of the wafer 20 along the direction of roller movement. In the case where the surface protection tape 500 or the dicing tape 51 is adhered on the wafer 20, therefore, the inconveniences described below occur.

First, with reference to FIG. 11a, the inconveniences caused when the surface protection tape 500 is adhered on the surface 21 of the wafer 20 are explained. In this case, the surface protection tape 500 at the ends 28, 29 of the wafer 20 is considerably compressed as compared with the center of the wafer 20 and the neighborhood thereof. At the ends 28, 29 of the wafer 20, therefore, the adhesive contained in the surface protection tape 500 is squeezed out from the wafer or intrudes into the details of the semiconductor elements 25. In detaching the surface protection tape 500 at the end of back grinding, therefore, the residue of the surface protection tape 500 may remain around the semiconductor element 25 in the neighborhood of the ends 28, 29. Also, when grinding (back grinding) the back surface 22 of the wafer 20 after adhering the surface protection tape 500, the surface protection tape 500 is directed downward. In the process, the thickness of the whole wafer 20 including the surface protection tape 500 at about the center of the wafer 20 is larger than the thickness at about the ends of the wafer 20. In the case where the wafer is back-ground under this condition, the thickness of the wafer 20 at about the ends 28, 29 is increased beyond that of the central portion thereof. This thickness difference remains as it is even after dicing, resulting in size variations in the formed semiconductor devices.

In FIG. 11b, the dicing tape 51 containing the DAF 52 is adhered to the back surface 22 of the wafer 20, after which a plurality of grooves 40 are formed on the surface 21 of the wafer 20 by a dicing device (not shown). In this case, the grooves 40 are formed by operating the dicing device with the intention of performing a full-cut operation. A part (chip) of the wafer including the semiconductor elements 25 in the neighborhood of the ends 28, 29 of the wafer 20 may still be half cut. Further, the thickness of the DAF 52 on the dicing tape 51 functioning as an adhesive at the time of die bonding varies between the central portion and the ends 28, 29. As a result, the chip thickness is varied after the die bonding or the adhesion of the DAF 52 may change. Also, the DAF portion may not be cut off.

In addition, though not shown, the chip may inconveniently assume different thicknesses at the central portion and the ends 28, 29 of the wafer 20 as in the case where back-grinding is conducted after dicing.

In order to obviate the inconveniences when adhering the dicing tape to the back surface of the wafer as described above, a substantially uniform pressure is required to be imparted over the whole wafer 20. Japanese Unexamined Patent Publication No. 2002-134438discloses a tape adhering method in which the dicing tape located between the roller and the wafer is adhered on the wafer by moving the roller along the upper surface of the wafer supported on a fixed table. In Japanese Unexamined Patent Publication No. 2002-134438, the force exerted on the wafer by moving the roller toward the fixed table can be adjusted by adjusting the roller position. As a result, an equal pressure can be imparted over the entire wafer. Also, the dicing tape 51 which may include the DAF 52 is adhered with the same thickness at about the central portion and the ends 28, 29 of the wafer 20 Japanese Unexamined Patent Publication No.2002-134438.

As long as the force is applied by the roller to the wafer, the tape located between the roller and the wafer is pulled in a slanting direction to the direction in which the roller proceeds. In this case, the tension applied to the tape is divided into a component in the direction in which the roller proceeds and a component in the direction opposite to the force applied to the wafer by the roller. Specifically, in Japanese Unexamined Patent Publication No. 2002-134438, the force of the roller acts in the direction toward the wafer, while the tension applied on the tape contains the force in the opposite direction. In the case where the force is applied to the wafer by moving the roller toward the table, therefore, the tension of the tape located between the roller and the wafer is also required to be taken into consideration.

The tape adhered to the wafer, however, is not necessarily the dicing tape but may be the surface protection tape. The tape characteristics such as the thickness, hardness and the bonding temperature are naturally varied from one tape to another, and therefore the tension of the tape cannot be easily determined.

Specifically, the tension of the tape contains the component opposite to the direction in which the force is applied to the wafer by the roller, and therefore, in the case where the roller is pressed against the wafer via the tape, the response of the pressure applied by the roller to the wafer become low, thereby making it difficult to perform a quick control operation. Further, in view of the fact that the weight of the roller itself is imposed on the wafer, it is actually difficult to accurately control the force applied on the wafer by the roller.

This invention has been developed in view of the situation described above, and the object thereof is to provide a tape adhering method, and a tape adhering apparatus for carrying out the method, in which an accurate, quick control operation is performed to impart an equal pressure over the whole wafer at the time of adhering the tape.

SUMMARY OF THE INVENTION

In order to achieve the object described above, according to a first aspect of the invention, there is provided a tape adhering apparatus for adhering a tape on a wafer, comprising:

a movable table, for supporting the wafer, movable in the direction at right angles to the tape adhering surface of the wafer on which the tape is adhered;

a tape adhering means for adhering the tape on the wafer by moving from a first end to a second end of the wafer in parallel to the tape adhering surface of the wafer; and a tape supply means for supplying the tape between the tape adhering surface of the wafer and the tape adhering means;

wherein the movable table is adapted to be advanced toward and retreated from the tape adhering means at right angles to the tape adhering means so that the tape adhering surface of the wafer on the movable table is pressed against the tape adhering means through the tape thereby to apply a pressing force on the tape adhering means; and wherein when the tape adhering means moves from the first end to the second end of the wafer, the contact pressure of the tape adhering surface of the wafer in contact with the tape adhering means via the tape is substantially constant.

Specifically, in the first aspect of the invention, the force exerted between the tape adhering means such as the roller and the wafer, via the tape, is obtained by moving only the movable table toward the tape adhering means. Therefore, the movement of the movable table does not interfere with the tension of the tape arranged above the movable table, and therefore the tape tension is not required to be taken into consideration when applying the force on the wafer by the movable table. As a result, the contact pressure applied on the wafer by the tape adhering apparatus can be accurately and quickly controlled to be uniform over the entire wafer. The contact pressure is defined as the pressure of the wafer per unit area.

According to a second aspect of the invention, there is provided with a tape adhering apparatus for adhering a tape to a wafer, comprising:

a movable table, for supporting the wafer, movable in the direction at right angles to the tape adhering surface of the wafer, the movable table being capable of applying the pressing force against the wafer;

a tape adhering means adapted to move from a first end to a second end of the wafer in parallel to the tape adhering surface to adhere the tape on the wafer; and a tape supply means for supplying the tape between the tape adhering surface of the wafer and the tape adhering means;

wherein the movable table is advanced toward and retreated from the tape adhering means in the direction at right angles to the tape adhering means so that the tape adhering surface of the wafer on the movable table is pressed with a pressing force against the tape adhering means through the tape;

the apparatus further comprising:

a tape adhering means moving distance calculation means for detecting the distance in which the tape adhering means moves from the first end of the wafer when the tape adhering means moves from the first end to the second end of the wafer in parallel to the tape adhering surface of the wafer; and a movable table pressing force setting means for setting the pressing force of the movable table using the distance in which the tape adhering means moves detected by the tape adhering means moving distance calculation means in such a manner that the pressure of the contact portion of the wafer is kept substantially constant when the tape adhering means moves from the first end to the second end of the wafer.

Specifically, in the second aspect of the invention, the force, exerted between the tape adhering means such as the roller and the wafer through the tape, is obtained by moving only the movable table toward the tape adhering means. Therefore, the tension of the tape arranged above the movable table does not interfere with the movement of the movable table and therefore is not required to be taken into consideration when applying the force on the wafer through the movable table. As a result, the pressure applied on the wafer by the tape adhering apparatus can be accurately and quickly controlled to be uniform substantially over the entire wafer. Also, in the second aspect of the invention, the pressing force of the movable table is set in accordance with the distance moved by the tape adhering means as calculated by the tape adhering means moving distance calculation means, and therefore the contact pressure applied on the wafer can be controlled more accurately to be substantially equal over the entire wafer.

According to a third aspect of the invention, there is provided a tape adhering apparatus of the second aspect, further comprising a contact area calculation means for calculating, from the distance in which the tape adhering means moves, the contact area based on the width of the contact portion of the wafer when the tape adhering means moves from the first end to the second end of the wafer in parallel to the tape adhering surface of the wafer;

wherein the movable table pressing force setting means sets the pressing force of the movable table in such a manner that the pressing force proportional to the contact area calculated by the contact area calculation means is applied to the wafer.

Specifically, in the third aspect of the invention, the pressing force of the movable table is set in accordance with the contact area between the tape adhering means and the wafer via the tape and, therefore the pressure applied to the wafer can be more accurately controlled to be substantially equal over the whole wave.

According to a fourth aspect of the invention, there is provided a tape adhering apparatus of the second aspect, wherein the size of the wafer is previously divided into a plurality of zones, and the pressing force of the movable table is set by the movable table pressing force setting means in such a manner that the pressing force depending on the corresponding one of the zones based on the distance of the tape adhering means calculated by the tape adhering means moving distance calculation means is applied on the wafer.

Specifically, in the fourth aspect of the invention, the pressing force of the movable table is set in accordance with a particular division zone corresponding to the distance in which the tape adhering means moves. Therefore, the contact area is not required to be calculated, and the movable table can be quickly and easily set by a comparatively simple method.

According to a fifth aspect of the invention, there is provided a tape adhering apparatus of any one of the first to fourth aspects, wherein the pressing force of the movable table is set using the size of the wafer.

Specifically, in the fifth aspect of the invention, the pressure imparted even on the wafers of different sizes can be equalized substantially accurately.

According to a sixth aspect of the invention, there is provided a tape adhering apparatus of any one of the first to fifth aspects, further comprising a fixed table arranged around the movable table to support an auxiliary adhering member, wherein the tape adhering means adheres the tape to both the auxiliary adhering member and the wafer.

Specifically, in the sixth aspect of the invention, even in the case where the thickness of the auxiliary adhering member is slightly different from the thickness of the wafer, the tape can be adhered on the auxiliary adhering means with the total load of the tape adhering means and on the wafer with the set pressing force by changing the pressing force of the movable table.

According to a seventh aspect of the invention, there is provided a tape adhering apparatus of any one of the first to sixth aspects, wherein the tape adhering surface of the wafer supported on the table faces downward, and the table is located above the tape supplied from the tape supply means and the tape adhering means.

Specifically, in the seventh aspect of the invention, the wafer can be conveyed directly to the dicing process in the subsequent stage without turning the wafer with the tape adhered thereon, and the auxiliary adhering means, upside down.

According to an eighth aspect of the invention, there is provided a tape adhering apparatus of any one of the first to seventh aspects, wherein the tape adhering surface of the wafer supported on the table is parallel to the vertical direction.

Specifically, in the eighth aspect of the invention, the pressure imparted to the wafer can be more accurately equalized over the whole wafer regardless of the weight of the table and the tape adhering means.

According to a ninth aspect of the invention, there is provided a method of adhering a tape on a wafer, comprising the steps of:

supporting a wafer on a movable table adapted to move in the direction at right angles to the tape adhering surface of the wafer and to apply the pressing force against the wafer;

supplying the tape between the tape adhering surface of the wafer and the tape adhering means by the tape supply means;

moving the table toward the tape adhering means and thereby pressing the tape adhering surface of the wafer on the table, with the pressing force, against the tape adhering means via the tape;

moving the tape adhering means in parallel to the tape adhering surface of the wafer from the first end to the second end of the wafer; and substantially keeping the contact pressure, of the tape adhering surface of the wafer in contact with the tape adhering means via the tape, constant when the tape adhering means moves from the first end to the second end of the wafer.

Specifically, in the ninth aspect of the invention, the force exerted between the tape adhering means such as the roller and the wafer via the tape is obtained by pressing only the movable table against the tape adhering means. As a result, the weight of the tape adhering means arranged above the movable table or the tension of the tape does not interfere with the movement of the movable table, and therefore the weight of the roller and the tension of the tape are not required to be taken into consideration when applying the force on the wafer from the movable table. With this tape adhering method, therefore, the contact pressure applied to the wafer can be accurately and quickly controlled to be substantially equal over the entire wafer.

According to a tenth aspect of the invention, there is provided a method, of adhering a tape on a wafer, comprising the steps of:

supporting a wafer on a movable table adapted to move in the direction at right angles to the tape adhering surface of the wafer on which the tape is adhered and adapted to apply a pressing force against the wafer;

supplying the tape between the tape adhering surface of the wafer and the tape adhering means by the tape supply means;

moving the table toward the tape adhering means and thereby pressing the tape adhering surface of the wafer on the table, with the pressing force, against the tape adhering means via the tape;

moving the tape adhering means from the first end of the wafer in parallel to the tape adhering surface of the wafer;

detecting the distance covered by the tape adhering means from the first end of the wafer by the tape adhering means covered distance calculation means;

calculating, from the distance in which the tape adhering means moves, the contact area of the contact portion of the wafer by a contact area calculation means when the tape adhering means moves from the first end to the second end of the wafer in parallel to the tape adhering surface of the wafer; and setting the pressing force of the movable table by the movable table pressing force setting means, using the distance in which the tape adhering means moves detected by the tape adhering means moving distance calculation means, in such a manner that the pressure at the contact portion of the wafer is kept constant when the tape adhering means moves from the first end to the second end of the wafer.

Specifically, in the tenth aspect of the invention, the force applied between the tape adhering means such as the roller and the wafer through the tape is obtained by moving only the movable table toward the tape adhering means. As a result, the tension of the tape arranged above the movable table does not interfere with the motion of the movable table and, therefore, the tape tension is not required to be taken into consideration when the force is applied to the wafer by the movable table. In this way, according to this tape adhering method, the pressure imparted on the wafer can be accurately and quickly controlled to be substantially uniform over the whole wafer. Also, in the tenth aspect of the invention, the pressing force of the movable table is set in accordance with the distance moved by the tape adhering means calculated by the tape adhering means moving distance calculation means, and therefore the contact pressure applied to the wafer can be more accurately controlled to be substantially equal over the entire wafer.

The aspects of the invention described above can share the effect that the contact pressure applied to the wafer, i.e. the pressure per unit area of the wafer, is accurately and quickly controlled to be substantially uniform over the whole wafer.

Further, the second aspect of the invention may exhibit the effect that the pressure applied to the wafer can be controlled more accurately to be substantially equal over the whole wafer.

Furthermore, the third aspect of the invention may exhibit the effect that the pressure applied to the wafer can controlled more accurately to be substantially equal over the whole wafer.

Further, the fourth aspect of the invention may exhibit the effect that the movable table can be quickly and easily set by a comparatively simple method.

In addition, the fifth aspect of the invention may exhibit the effect that the pressure applied to the wafer can be equalized substantially accurately even for different wafer sizes.

Further, the sixth aspect of the invention may exhibit the effect that even in the case where the thickness of the auxiliary adhering member is slightly different from the thickness of the wafer, the tape can be adhered on each of the auxiliary adhering means and the wafer under the intended pressure by changing the pressing force of the movable table.

Further, the seventh aspect of the invention may exhibit the effect that the wafer can be conveyed directly to the dicing process or the back grinding process in a subsequent stage without the wafer with the tape adhered thereon being turned upside down.

Further, the eighth aspect of the invention may exhibit the effect that the pressure applied to the wafer can be more accurately equalized over the whole wafer regardless of the weight of each member and the tape tension into consideration.

Further, the tenth aspect of the invention may exhibit the effect that the pressure applied to the wafer can be controlled more accurately to be substantially equal over the whole wafer.

These and other objects, features and advantages of the present invention will be more apparent in light of the detailed description of exemplary embodiments thereof as illustrated by the drawings.

BRIEF DESCRIPTION OF THE DRAWINGS

FIG. 10b is a diagram showing the relation between the force exerted on the wafer and the distance from an end one the wafer in FIG. 10a.

DESCRIPTION OF THE PREFERRED EMBODIMENTS

Figure 1:
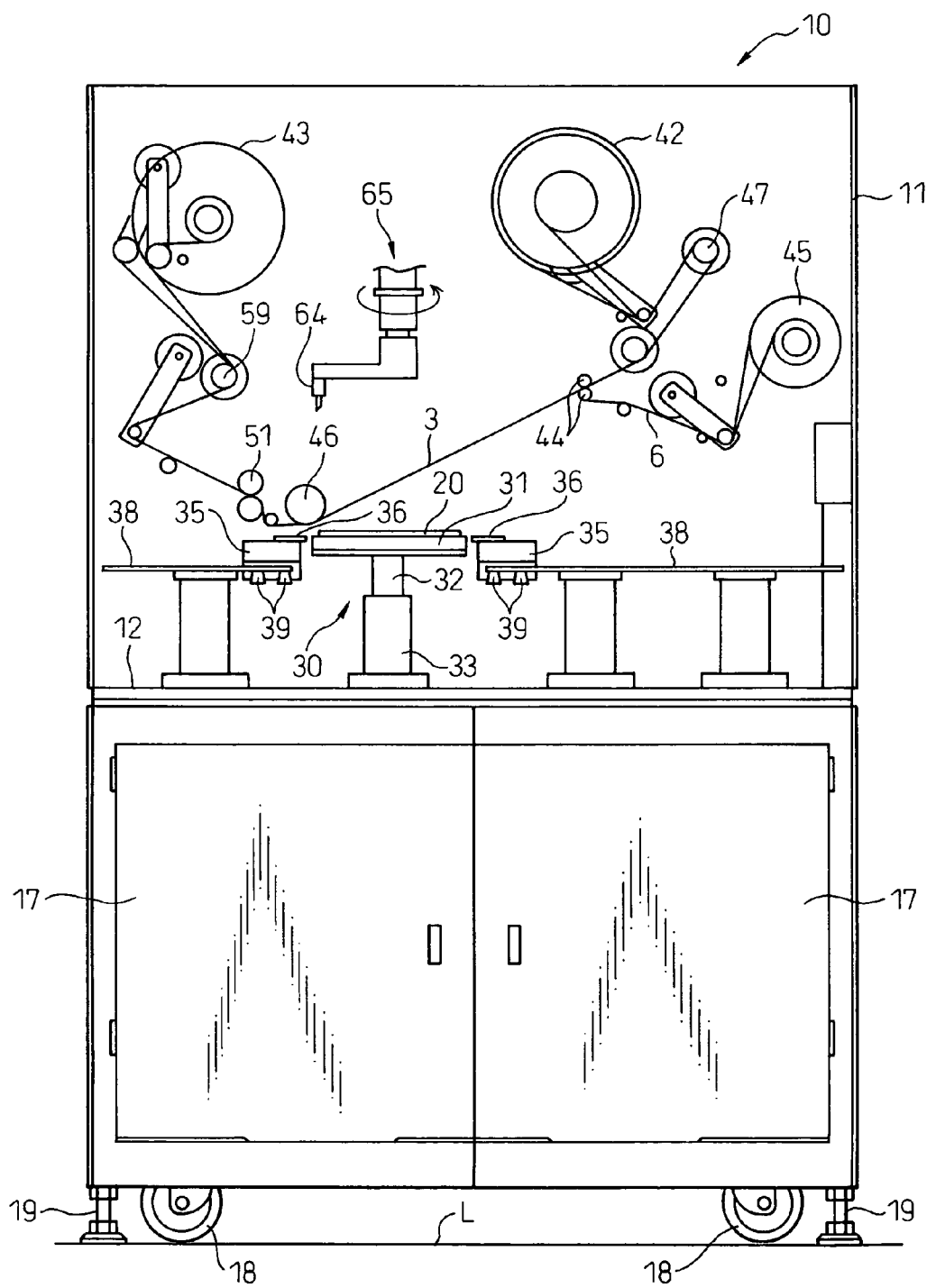
FIG. 1 is a sectional view schematically showing a tape adhering apparatus according to this invention.

Embodiments of the invention are explained below with reference to the accompanying drawings. In the drawings, the same component parts are designated by the same reference numerals, respectively. For ease of understanding, these drawings are shown in different scales as required.

FIG. 1 is a sectional view schematically showing a tape adhering apparatus according to the invention. The tape adhering apparatus 10 shown in FIG. 1 comprises a housing 11 which contains a supply unit 42 for supplying a tape 3, for example a dicing tape or a surface protection tape to be adhered on a wafer 20, for example a silicon wafer, and a take-up unit 43 for taking up the tape from the supply unit 42. As shown in FIG. 1, a plurality of castors 18 and a plurality of stoppers 19 are arranged on the bottom surface of the housing 11. The tape adhering apparatus 10 can be moved to the desired position on the floor L by the castors 18, and fixed at the same position by the stoppers 19. A door 17 is arranged in the lower part of the tape adhering apparatus 10. By opening the door 17, a control unit 80 such as a digital computer arranged in the lower part of the tape adhering apparatus 10 and not shown can be accessed.

As shown in FIG. 1, a guide roll 47 for guiding the tape 3 and applying a predetermined tension to the tape 3 is arranged downstream of the supply unit 42, and a pair of detaching rolls 44 are arranged downstream of the guide roll 47. The detaching rolls 44 have the function to detach a release 6 of the tape 3, and the release 6 is taken up by a release take-up unit 45. On the other hand, a guide roll 51 for guiding the tape 3 and a take-up unit 43 for taking up the tape 3 are arranged downstream of the detaching roll 44. Also, a dancer roll 59, adapted to be operated in accordance with the amount of the tape 3 supplied, is arranged between the guide roll 51 and the take-up unit 43.

Figure 2:
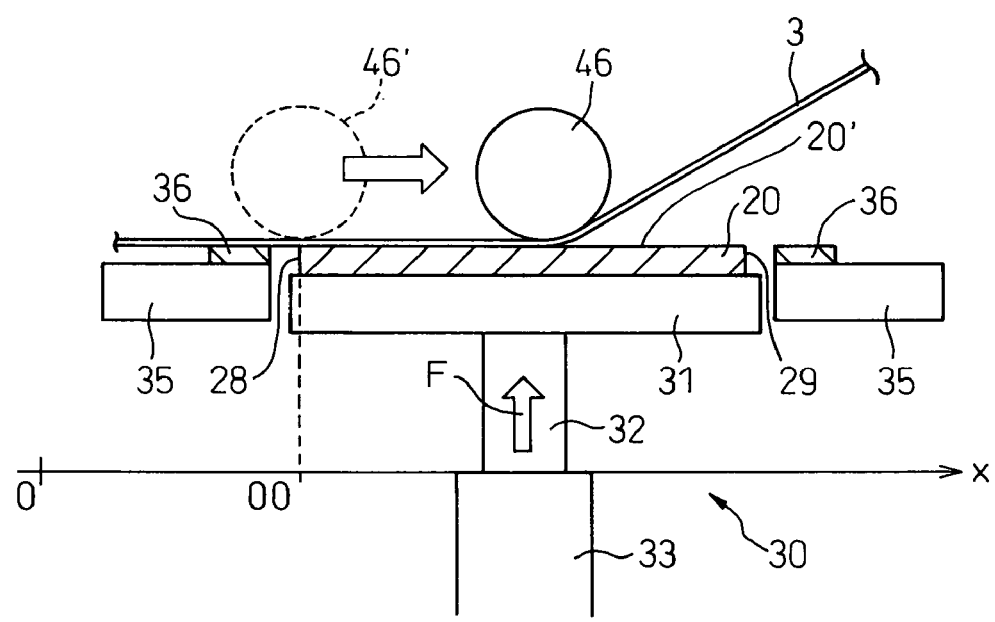
FIG. 2 is a partly enlarged view of a table lift.

As shown in FIG. 1, a table lift 30 is arranged on a rack 12 at an intermediate portion of the tape adhering apparatus 10. FIG. 2 is a partly enlarged view showing a part of the table lift 30. The table 31 of the table lift 30 is adapted to support the wafer 20 by absorption or the like. A substantially cylindrical base 33 of the table lift 30 is arranged on the rack 12. The forward end of an axial portion 32 extending from the lower surface of the table 31 is inserted into the cylindrical base 33. The table lift 30 is connected to a lift mechanism 50 not shown. The table 31 is adapted to be moved up and down by an air cylinder (not shown) in the lift mechanism 50. This air cylinder is connected to a computer in the control unit 80 through an electropneumatic proportionality valve (not shown) to adjust and set the position of the table 31.

As shown in FIGS. 1 and 2, a fixed table 35 is arranged adjacent to the table 31 of the table lift 30. Especially, as shown in FIG. 1, the fixed table 35 is fixed by screws 39 to a stage 38 arranged on the rack 12 of the housing 11. As can be seen from FIGS. 1 and 2, the fixed table 35 is formed with a hole corresponding to the contour of the table 31, so that the wafer 20 and the table 31 can move and down through the hole of the fixed table 35. In the case where the tape 3 is the dicing tape, as can be understood specifically from FIG. 2, a mount frame 36 is arranged on the fixed table 35. The mount frame 36 has the function to hold each part of the wafer 20 when cutting into cubes by dicing.

As shown in FIG. 2, a roller 46 adapted to reciprocate horizontally in the housing 11 is arranged above the table lift 30. The length of the roller 46 is larger than the maximum width of the wafer 20 and the table 31. Though not shown, the roller 46 is connected to an endless chain suspended, for example, on two pulleys connected to a motor not shown. By driving the motor in forward and reverse directions, the roller 46 is reciprocated horizontally between the pulleys. The roller 46 may of course be reciprocated horizontally by another drive mechanism. As can be understood from FIG. 2, the roller 46 is moved horizontally from the first end 28 to the second end 29 of the wafer 20 diametrically of the wafer 20 thereby to adhere the tape 3 on the wafer 20.

Referring again to FIG. 1, a cutter unit 65 is arranged above the table lift 30 and the roller 46. The cutter unit 65 has a rotatable cutter 64 adapted to reciprocate vertically. After adhering the tape, the cutter unit 65 is moved to the wafer 20 and then the cutter 64 is rotated along the peripheral edge of the wafer 20. In this way, the tape 3 adhered on the wafer 20 can be cut off.

Figure 3:
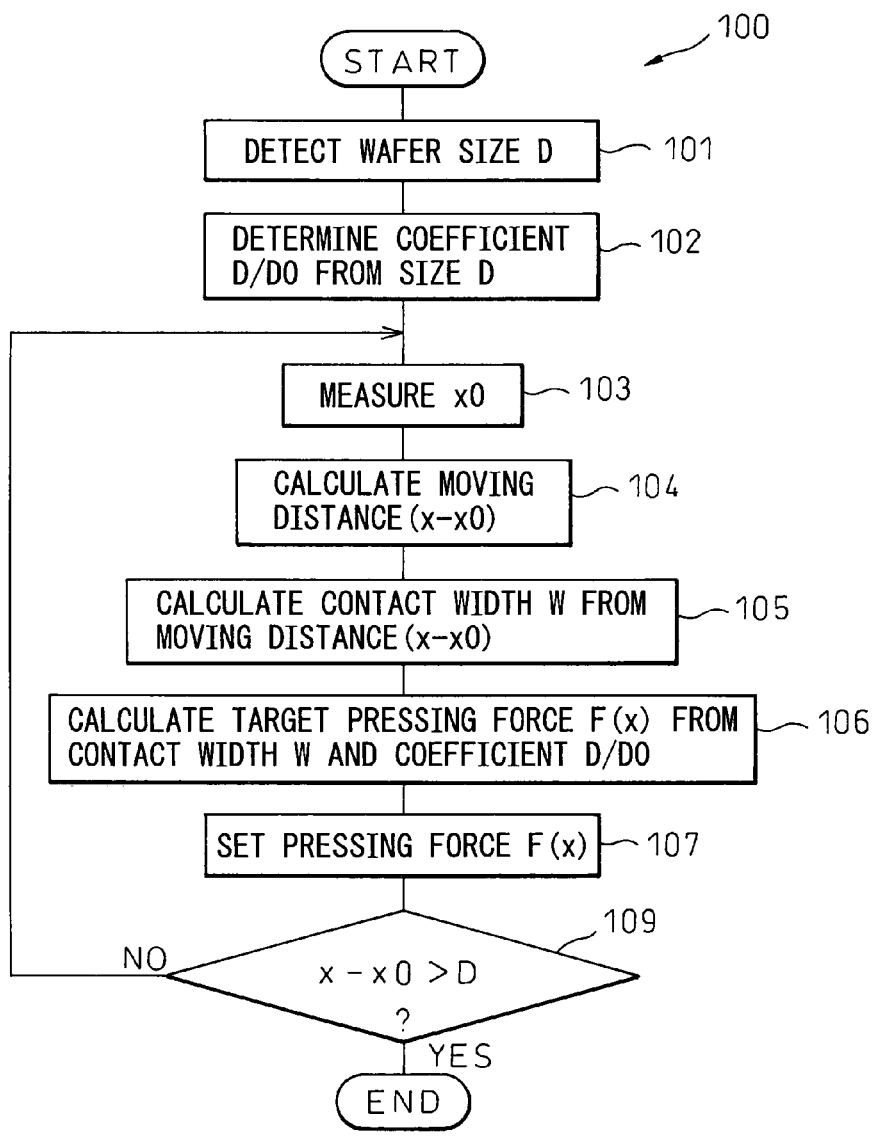
FIG. 3 is a flowchart showing a first operation program of the tape adhering apparatus according to the invention.

FIG. 3 is a flowchart showing the first operation program of the tape adhering apparatus according to the invention. The program 100 shown in FIG. 3 is stored in a memory such as a ROM or a RAM of a control unit 80 and executed by the control unit 80. This program 100 is executed at the same time that the wafer 20 is supported by adsorption at the center of the table 31 of the table lift 30 by a loader not shown and the roller 46 (shown by dotted line with reference numeral 46' in FIG. 2) arranged at a position corresponding to the first end 28 of the wafer 20 begins to move in the direction of arrow along the tape adhering surface 20' of the wafer 20.

In the drawings including FIG. 2, a surface of the wafer 20 on which the tape 3 is adhered is called the tape adhering surface 20' for convenience sake. In the case where the tape 3 is the dicing tape, however, the tape adhering surface 20' is the back surface 22 of the wafer 20, while in the case where the tape 3 is the surface protection tape, the tape adhering surface 20' is the front surface 21 of the wafer 20.

At step 101 of the program 100 shown in FIG. 3, the size D, the diameter of the wafer 20 used, is detected. The size of the wafer 20 is detected by a sensor (not shown) arranged diametrically or concentrically on the table 31 of the table lift 30. Normally, the size D of the wafer 20 is predetermined at about 200 mm (8 inches), about 300 mm (12 inches) or about 400 mm (16 inches). By arranging a sensor at a position corresponding to any of these predetermined values, the size D of the wafer 20 can be easily detected. As an alternative, at step 101, the size D of the wafer 20 can be input directly from an input unit, not shown, of the control unit 80 by the operator of the tape adhering apparatus 10. As another alternative, a plurality of sizes D are stored in the memory of the control unit 80, and the desired size D is selected from them.

Next, at step 102, the ratio of the size D of the wafer 20 to a predetermined size D0, i.e. the coefficient D/D0 is determined. The predetermined size D0 can be the maximum size of the wafer 20 that can be supported on the table 31 of the tape adhering apparatus 10. The process then proceeds to step 103 at which the distance x0 from the origin 0 at a certain position (refer to FIG. 4) to the first end 28 of the wafer 20 is measured using an encoder or the like not shown. The first end 28 of the wafer 20 located at a position x0 away from the origin 0 is assumed to be a measurement starting point 00.

Then, at step 104, the distance (x−x0) moved by the roller 46 from the measurement starting point 00 is calculated. As understood from FIG. 4 described later, the moved distance (x−x0) is the one moved by the roller 46 on the wafer 20. The measurement starting point 00 coincides with the first ends 28 of the wafers 20 for each size. While the roller 46 is moving from the first end 28 toward the second end 29 of the wafer 20, the distance (x−x0) moved by the roller 46 is calculated from the number of revolutions of the motor connected to the pulleys described above.

Figure 4:
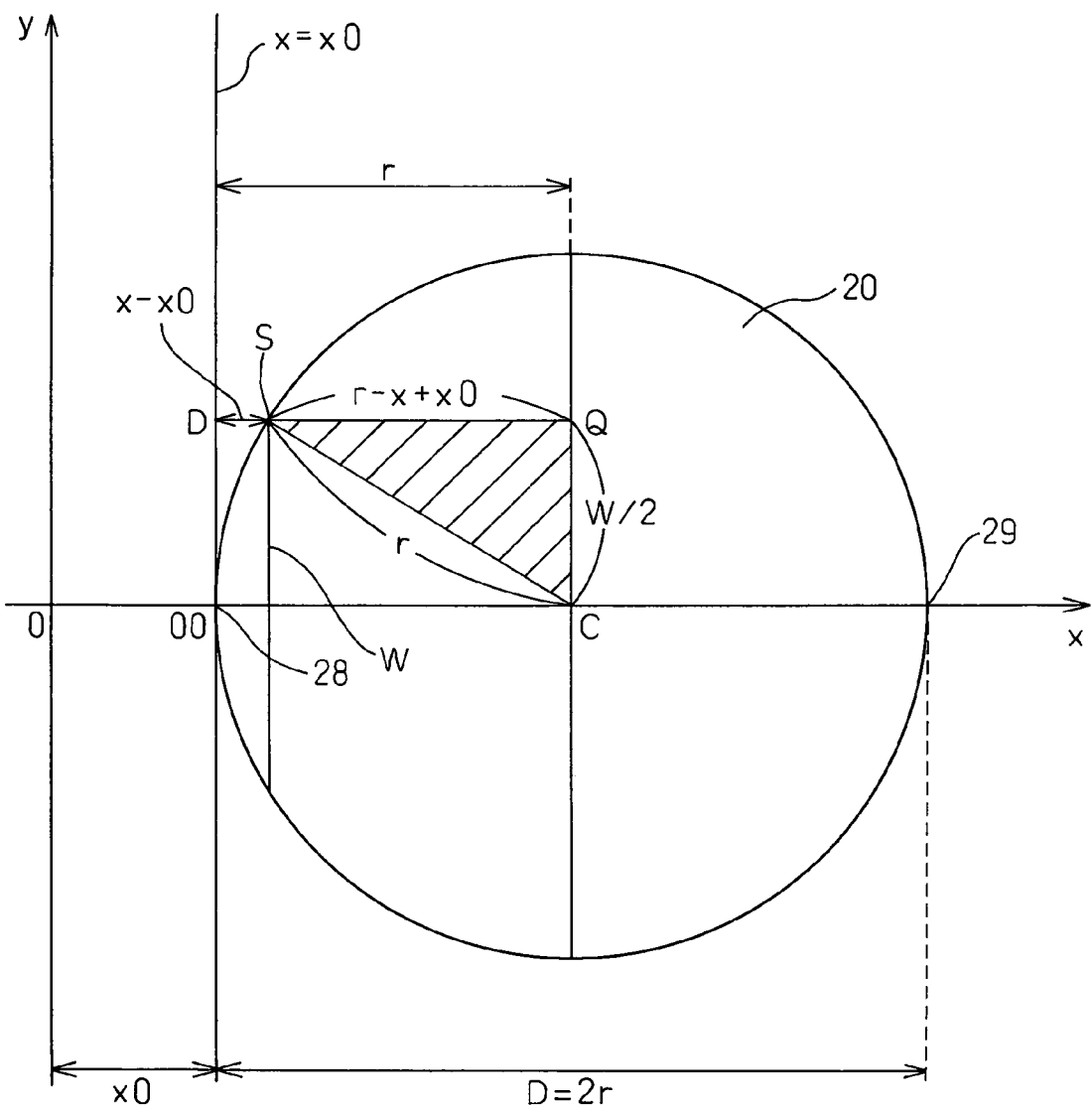
FIG. 4 is a diagram for explaining the contact width W.

Next, at step 105, the width W of the wafer 20 in contact with the roller 46 via the tape 3 is calculated using the distance (x−x0) moved by the roller 46. FIG. 4 is a diagram for explaining the contact width W, in which the wafer 20 is viewed from above. In FIG. 4, the first end 28 of the wafer 20 constitutes the measurement starting point 00, and the horizontally-extending y axis intersects the x axis at right angles thereto at the origin 0. As shown in FIG. 4, the center C of the circular wafer 20 is located on the x axis. The wafer 20 is in linear contact with the roller 46 along a line parallel to the y axis. In this specification, this linear contact area is called the contact width W. In the embodiment shown in the accompanying drawings, the origin 0 is located outside the wafer 20. In the case where the wafer 20 of maximum size is used, however, the first end 28 of the wafer 20 may be set as the origin 0. In this case, the origin 0 equal to the measurement starting point 00, and therefore x0=0.

The contact width W of the wafer 20 in contact with the roller 46 for the distance (x−x0) moved by the roller 46 is determined in the manner described below. In FIG. 4, a point at which the contact width W intersects the peripheral edge of the wafer 20 is defined as a crossing point S. Also, the point at which the line segment extending parallel to the x axis through the crossing point S intersects the line segment passing through the center C of the wafer orthogonally to the x axis is defined as a crossing point Q. Further, the point at which the line segment extending parallel to the x axis through the crossing point S intersects the line segment x=x0 is defined as a crossing point D. As shown in FIG. 4, the line segment SC is equal to the radius r of the wafer 20. Also, as the wafer 20 is symmetric about the x axis, the line segment QC is equal to one half of the contact width W. Further, the line segment DQ is equal to the line segment 00C (=r) on the x axis and the line segment DS equal to the distance (x−x0). Thus, the line segment SQ is equal to (r−x+x0). In the triangle SQC shown in FIG. 4, therefore, the contact width W is given by equation (1) below.

$$W = 2\sqrt{r^2 - (r - x + x0)^2} \quad (1)$$

Figure 5A:
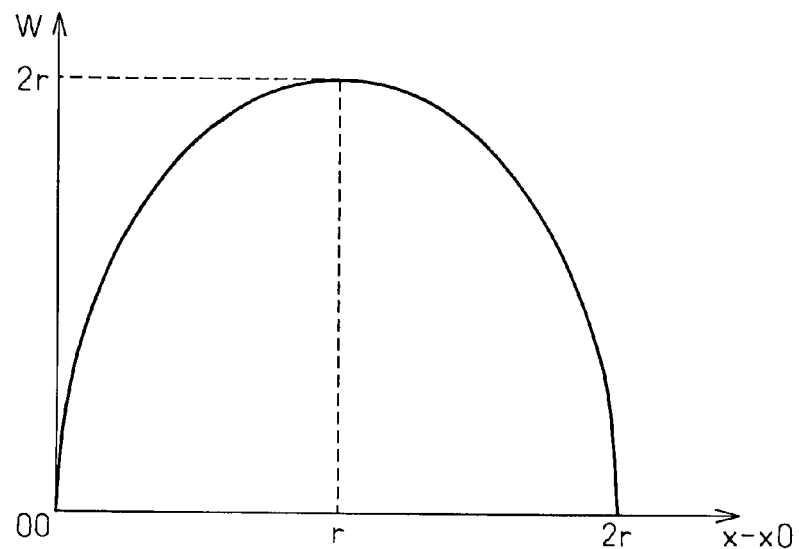
FIG. 5a is a diagram showing the relation between the distance (x−x0) in which the roller moves and the width W of the wafer kept in contact with the roller via the tape.

The behavior of the contact width W during the movement of the roller 46 will be explained. FIG. 5a is a diagram showing the relation between the distance (x−x0) moved by the roller 46 from the measurement starting point 00 and the width W of the wafer 20 in contact with the roller 46 via the tape 3. In FIG. 5a, the abscissa represents the distance (x−x0) moved by the roller 46 from the measurement starting point 00, and the ordinate represents the contact width W described above. As shown in FIG. 5a, at the initial position (see the roller 46' shown by dotted line in FIG. 2) where the center of the roller 46 corresponds to the first end 28 of the wafer 20, the contact width W is almost zero and the roller 46 and the first end 28 of the wafer 20 are in contact with each other at a point. With an increase in the moving distance x, the contact width W increases in accordance with the equation described above and, when the moving distance x coincides with the radius r of the wafer 20, the contact width W assumes the maximum value 2r (=D). After that, the contact width W gradually decreases, and is reduced substantially to zero again when the covered distance x is 2r. According to this embodiment, a circular wafer 20 is used, and therefore the contact width W is symmetrical about a line at the position where the moving distance (x−x0) is equal to the radius r.

Referring again to FIG. 3, at step 106, the target value of the pressing force F(x) under which the wafer 20 is pressed against the roller 46 via the tape 3 by the table 31 of the table lift 30 is calculated from the coefficient D/D0 calculated at step 102 and the contact width W calculated at step 105. The target pressing force F(x) is calculated based on a predetermined pressing force F0. The predetermined pressing force F0 is the maximum force exerted on the wafer 20 in the case where the wafer 20 of maximum size possible is supported on the table 31 of the table lift 30 and the distance (x−x0) moved by the roller 46 corresponds to the radius r, i.e., in the case where the axial line of the roller 46 is located at the center of the wafer 20. In the case where the distance (x−x0) moved by the roller 46 is equal to the radius r, the contact width W is equal to the diameter D (=2r) of the wafer 20. This contact width W may correspond to the contact area A of the portion of the water 20 in contact with the roller 46 via the tape 3.

Strictly speaking, the wafer 20 and the roller 46 are not in contact with each other via the tape 3 along a line but over a surface with a minute distance in the x direction. By multiplying the contact width W by a coefficient corresponding to the minute distance, therefore, the contact area A can be calculated with a higher accuracy.

Figure 5B:
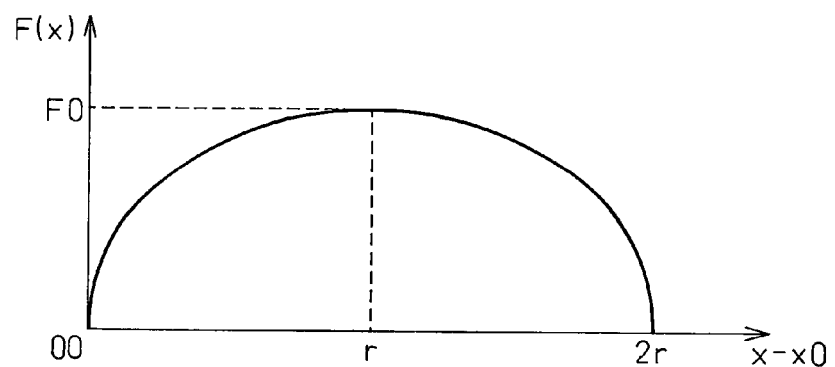
FIG. 5b is a diagram showing the relation between the distance (x−x0) in which the roller moves and the holding pressure F(x).
Figure 5C:
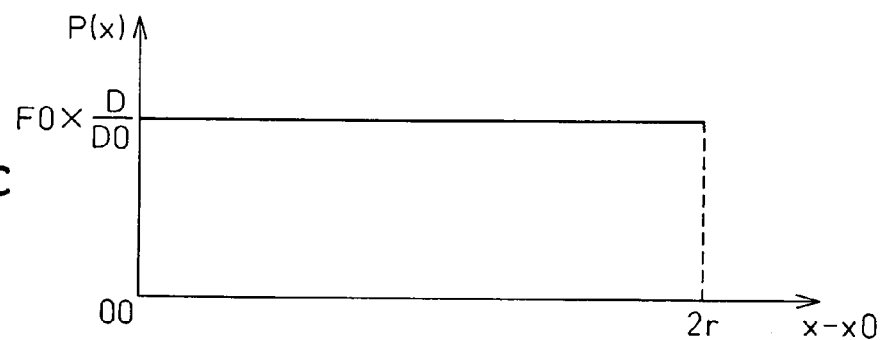
FIG. 5c is a diagram showing the relation between the distance (x−x0) in which the roller moves and the pressure P(x).

According to this invention, the pressing force F(x) exerted on the wafer 20 in contact with the roller 46 is determined in such a manner that a constant pressure P(x) is exerted on the contact area A. FIG. 5b is a diagram showing the relation between the distance (x−x0) moved by the roller and the pressing force F(x), and FIG. 5c the relation between the distance (x−x0) moved by the roller and the pressure P(x). In these drawings, the abscissa represents the distance (x−x0) moved and the ordinate represent the pressing force F(x) and the pressure P(x). As shown in FIG. 5c, in order to keep a constant pressure P(x) when the roller 46 moves on the wafer 20 (0≦x−x0≦2r) with the moving distance (x−x0) smaller than the radius r (0≦x−x0<r), the pressing force F(x) is increased with the contact width W, i.e. the contact area A. In the case where the moving distance (x−x0) is not less than the radius r and not more than twice the radius r (r≦x−x0≦2r), on the other hand, the pressing force F(x) is required to be decreased with the contact width W. Taking into consideration the fact that the pressure is a force exerted on a unit area, the pressing force F(x) according to the invention is given by equation (2) (see FIG. 5b).

$$F(x) = F0 \times W \times D / D0 \quad (2)$$
$$= (2F0 \cdot D/D0)\sqrt{r^2 - (r - x + x0)^2}$$

This pressing force F(x) is applied to the wafer 20 so that the pressure P(x) assumes a constant value (=F0·D/D0 ) regardless of the distance (x−x0) in which the roller 46 moves from the first end 28 to the second end 29 of the wafer 20.

In this equation, the coefficient D/D0 is multiplied to apply the pressing force F(x) corresponding to the size of the wafer 20 to the wafer 20. Specifically, the pressing force F(x) applied to the wafer 20 of size D is always D/D0 times smaller than the force applied to the wafer 20 of maximum size D0 . In the case where the tape 3 is adhered by the same tape adhering apparatus on a plurality of wafers 20 different in size, the initial setting such as the maximum pressing force is required to be changed each time in accordance with the size of the wafer 20. In view of the fact that the pressing force F(x) is calculated after multiplying the coefficient D/D0 according to the invention, however, the initial setting is not required to be changed for a different size of the wafer 20 even in the case where the tape 3 is adhered on the wafer 20 of a different size. Thus, the tape 3 can be adhered on the wafer 20 continuously without suspending the job. Naturally, the value of the pressure P may be changed by further multiplying F0 with a predetermined value.

As another alternative, a predetermined coefficient corresponding to the hardness, thickness and the bonding temperature of an adhesive used for the tape 3 is determined in advance and stored in the memory of the control unit 80. The target pressing force F(x) thus is calculated by multiplying the coefficient appropriately. In this case, the target pressing force F(x) can be calculated with a higher accuracy.

Next, the process proceeds to step 107, where the air cylinder (not shown) of the table lift 30 is adjusted through the control unit 80 in such a manner that the table 31 can apply the pressing force F(x) corresponding to the distance (x−x0) to the wafer. The force applied to the air cylinder is varied with target pressing force F(x) and also with the type of the tape 3 used. Thus, the force applied to the air cylinder is determined as a map experimentally in advance as a function of the type of the tape 3 and the target pressing force F(x), and stored in the memory such as a ROM or a RAM of the control unit 80. At step 107, the force applied to the air cylinder is determined from this map, so that the table 31 is set to apply the pressing force F(x) to the wafer.

As understood from the relation between the pressing force F(x) and the moving distance (x−x0) shown in FIG. 5b, the pressing force F(x) applied to the wafer 20 is increased in the case where the moving distance (x−x0) is between 0 and the radius r ($0 \leq x-x0 < r$). In the case where the moving distance (x−x0) is between the radius r and twice the radius r ($r \leq x-x0 \leq 2r$), on the other hand, the pressing force F(x) applied to the wafer 20 is reduced (see the equation (2)). In this way, the pressing force F(x) is adjusted in such a manner that a constant pressure P(x) is imparted regardless of the moving distance (x−x0) of the roller 46. Specifically, according to the invention, the pressing force F(x) of the table 31 is adjusted to exert a constant pressure on the contact portion of the wafer 20 taking into consideration that the contact width W changes with the moving distance (x−x0).

Next, at step 109, it is determined whether the moving distance (x−x0) of the roller 46 calculated at step 104 is larger than the diameter D of the wafer 20, i.e. twice the radius r. In the case where the moving distance (x−x0) is not larger than the diameter D, i.e. in the case where the moving distance (x−x0) is equal to or less than the diameter D, the process proceeds to step 103 to repeat the previous operation. In the case where it is determined that the moving distance (x−x0) is larger than the diameter D, on the other hand, the roller 46 is considered to have exceeded the second end 29 of the wafer 20 and therefore the process is terminated. After that, the cutter unit 65 is rotated so that the tape 3 adhered on the wafer 20 is cut appropriately along the periphery of the wafer 20.

As described above, according to the invention, the pressing force F(x) applied to the wafer 20 is adjusted by only changing the force to move the table 31 upward. As shown in FIG. 2, the tape 3 is pulled diagonally upward and, therefore, the tension of the tape 3 between the roller 46 and the wafer 20 includes the upward component of the force. In the case where the tape 3 is held against the wafer 20 and adhered on the wafer 20 simply by pressing down the roller 46 vertically toward the table as in the prior art, therefore, the tension of the tape 3 between the roller 46 and the wafer 20 acts in the opposite direction to the pressed down roller 46, thereby making it difficult to accurately control the adhering operation. According to the invention, in contrast, the roller 46 is moved not vertically but only horizontally, and further, only the table 31 is moved vertically to adhere the tape 3 on the wafer 20. Specifically, according to the invention, the tension applied to the tape 3 includes the component in the same direction that the table 31 is pressed. When moving the table 31 toward the roller 46, therefore, the tension of the tape 3 need not taken into consideration. As a result, according to the invention, the pressure exerted on the wafer when adhering the tape on the wafer 20 on the table 31 is controlled accurately to assume a substantially equal value over the whole wafer. Further, according to the invention, the force in the opposite direction based on the tension of the tape 3 is not required to be taken into consideration when moving the table 31 toward the roller 46. Therefore, the table 31 can be moved rapidly to the desired position.

As described above, a substantially equal pressure can be imparted over the whole wafer 20 by the tape adhering apparatus 10 according to the invention. Specifically, according to the invention, the pressure is changed in such a manner that the ends 28, 29 of the wafer 20 or the neighborhood thereof are not extremely pressed. Thus, the surface pressure, i.e. the pressure per unit area of the wafer is substantially equal over the whole wafer. Further, in the case where the tape 3 is the surface protection tape adhered on the surface 21 of the wafer 20 at the time of back grinding, the surface protection tape is prevented from biting into the semiconductor element 25 at about the ends 28, 29 of the wafer 20 and remaining as a residue when datching the tape 3.

Also, according to the invention, a substantially equal pressure is applied over the whole wafer 20, and therefore the thickness of the tape 3 is substantially equal over the whole wafer 20 as a matter of course. In the case where the tape 3 is the surface protection tape, therefore, the thickness of the wafer 20 after back grinding is substantially equal over the whole wafer 20, so that the thickness of the semiconductor device finally produced is also uniform in thickness. In the case where the tape 3 is the dicing tape adhered on the back surface of the wafer 20 at the time of dicing, on the other hand, the wafer 20 can be full cut or half cut accurately in its entirety. Even in the case where the dicing tape contains DAF as an adhesive, the thickness of the DAF layer is equal at the time of die bonding and the bonding strength due to DAF is uniform.

In the case where the tape 3 is the dicing tape adhered on the back surface 22 of the wafer 20, an annular mount frame 36 shown in FIG. 2 is used. The origin 0 may be located at other point such as the outer peripheral end or the inner peripheral end of the fixed table 35. Thus, the roller 46 can adhere the tape 3 firmly on the mount frame 36. The thickness of the mount frame 36 may happen not to be completely the same as the thickness of the wafer 20. As the table 31 is moved upward as shown in the embodiments, however, the tape 3 can be positively adhered on the mount frame 36 and the wafer 20. Incidentally, even in the case where the tape 3 is the surface protection tape, an annular member having the same shape as the mount frame 36 can, of course, be used.

An air cylinder (not shown) used to move up and down the table 31 in FIG. 2 is connected to the shaft 32 of the table lift 30 through a load cell (not shown). The load cell in turn is connected to the control unit 80. The feedback control is possible, therefore, by determining the actual pressing force F from the load cell (not shown) and comparing the actual pressing force F with the target pressing force F(x). The actual pressing force F can be determined also by means other than a load cell.

Figure 6:
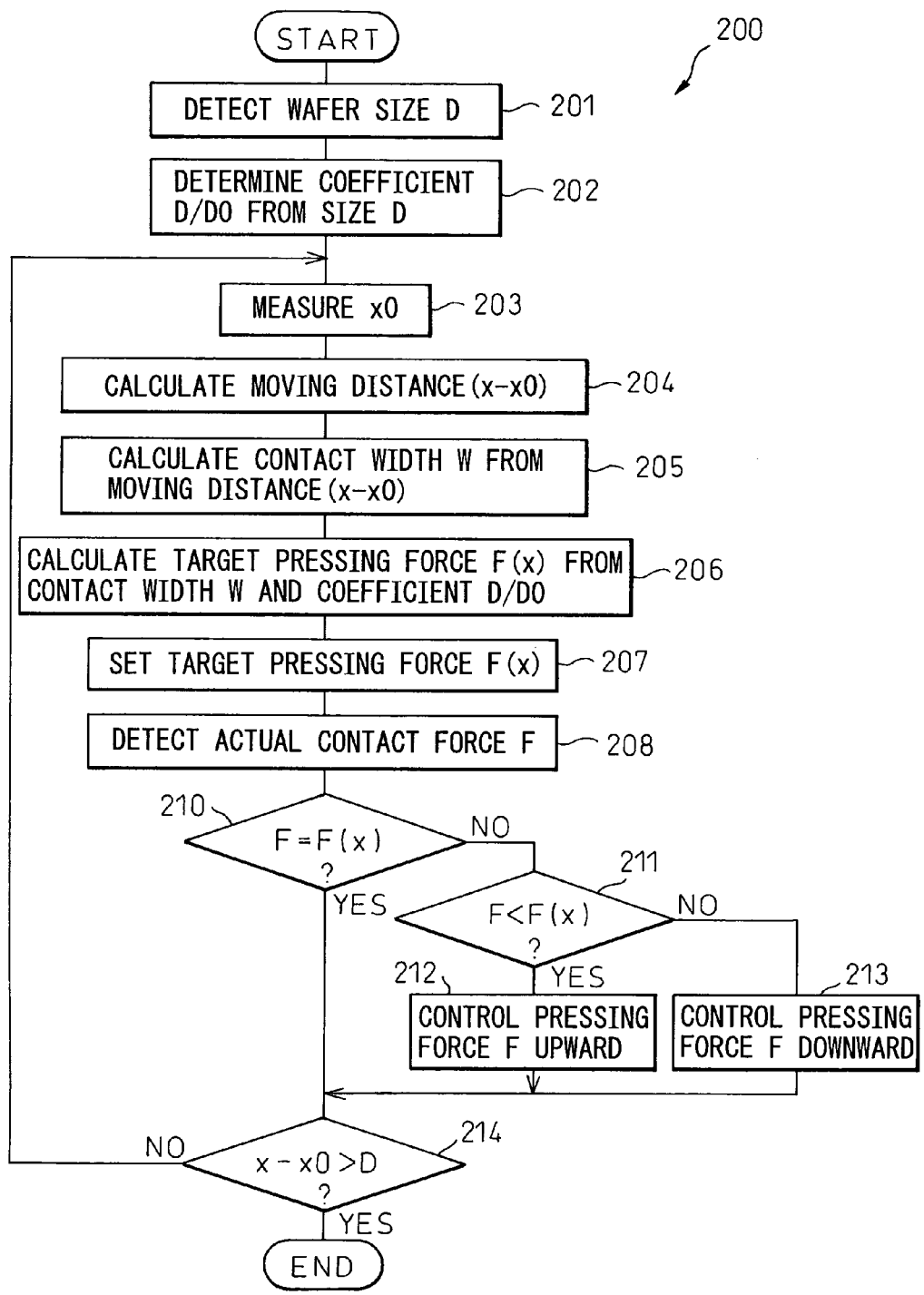
FIG. 6 is a flowchart showing a second operation program of the tape adhering apparatus according to the invention.

FIG. 6 is a flowchart showing the second operation program of the tape adhering apparatus according to the invention used for the feedback control operation described above. Like the program 100 shown in FIG. 3, the program 200 shown in FIG. 6 is also stored in the memory of the control unit 80 and executed by the control unit 80. Steps 201 to 207 of the program 200 shown in FIG. 6 are similar to steps 101 to 107 of the program 100 shown in FIG. 3 and therefore not described again.

At step 208 of the program 200, the actual pressing force F is detected from the load cell described above. Then, at step 210, the control unit 80 determines whether the actual pressing force F is equal to the target pressing force F(x) calculated at step 206. In the case where the actual pressing force F and the target pressing force F(x) are equal to each other, the actual pressing force F behaves the same way as the target pressing force F(x) shown in FIG. 5b, and therefore requires no adjustment. In this case, therefore, the process proceeds to step 214. In the case where the actual pressing force F and the target pressing force F(x) are not equal to each other, on the other hand, the process proceeds to step 211.

At step 211, it is determined whether the actual pressing force F is smaller than the target pressing force F(x) or not. In the case where the actual pressing force F is smaller than the target pressing force F(x), the process proceeds to step 212 while, in the case where the actual pressing force F is not smaller than the target pressing force F(x), i.e. in the case where the actual pressing force F is larger than the target pressing force F(x), the process proceeds to step 213.

At step 212, the actual pressing force F of the table 31 is increased to a value equal to the target pressing force F(x). In the process, the difference (F(x)−F) between the target pressing force F(x) and the actual pressing force F is calculated, and the actual pressing force F may be increased by an amount corresponding to the difference.

At step 213, on the other hand, the actual pressing force F of the table 31 is decreased to a value equal to the target pressing force F(x). In the process, the difference (F−F(x)) between the target pressing force F(x) and the actual pressing force F is calculated, and the actual pressing force F may be decreased by an amount corresponding to the particular difference.

Next, at step 214, it is determined whether the moving distance (x−x0) of the roller 46 calculated at step 204 is larger than the diameter D, i.e. twice the radius r of the wafer 20 or not. In the case where the moving distance (x−x0) is not larger than the diameter D, i.e. in the case where the moving distance (x−x0) is equal to or less than the diameter D, the process proceeds to step 203 to repeat the same operation. In the case where it is determined that the moving distance (x−x0) is larger than the diameter D, on the other hand, the roller 46 is considered to have exceeded the second end 29 of the wafer 20 and therefore the process is ended. After that, the cutter unit 65 is rotated so that the tape 3 adhered on the wafer 20 is appropriately cut off along the periphery of the wafer 20. As described above, in the program 200 shown in FIG. 6, the actual pressing force F is detected and compared with the target pressing force F(x) thereby to adjust the actual pressing force F of the table 31. Therefore, a control operation more accurate than of the program 100 shown in FIG. 3, can be performed.

In the programs 100, 200 shown in FIGS. 3, 6, the contact width W and the target pressing force F(x) are calculated each time from the moving distance (x−x0) of the roller 46. As an alternative, the diameter D of the wafer 20 is divided into N (N: natural number not less than 2) zones, and the pressing force F of the table 31 is set in such a manner as to obtain the target pressing force F(x) predetermined for each zone.

Figure 7:
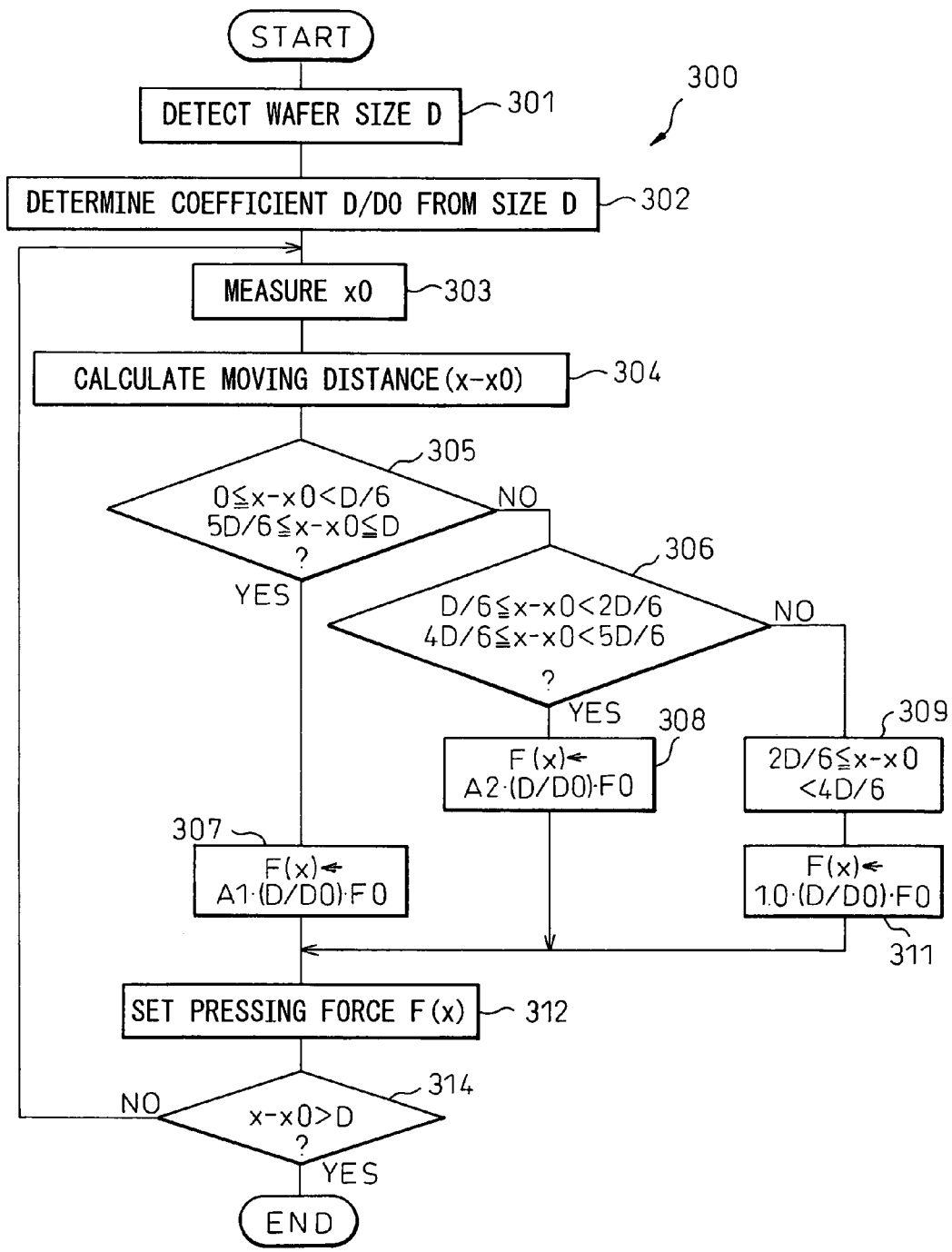
FIG. 7 is a flowchart showing a third operation program of the tape adhering apparatus according to the invention.
Figure 8A:
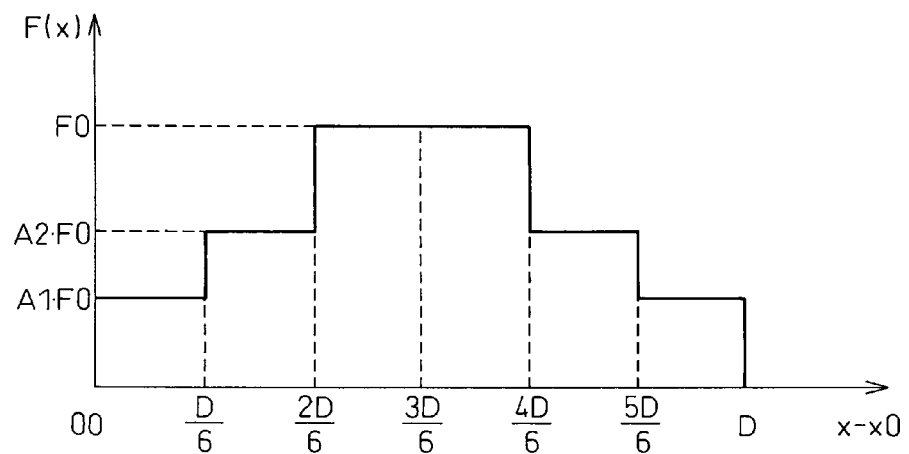
FIG. 8a is a diagram showing the relation between the distance (x−x0) in which the roller moves and the target holding pressure F(x) for the program shown in FIG. 7.

FIG. 7 is a flowchart showing the third operation program of the tape adhering apparatus according to the invention with the diameter D of the wafer 20 divided into six zones, as an example. The program 300 shown in FIG. 7, like the other programs, is stored in the memory of the control unit 80 and executed by the control unit 80. FIG. 8a is a diagram showing the relation between the moving distance (x−x0) of the roller 46 and the target pressing force F(x) for the program 300 shown in FIG. 7, and FIG. 8b the relation between the moving distance (x−x0) of the roller 46 and the pressure P(x) for the program 300 shown in FIG. 7.

Steps 301 to 304 of the program 300 in FIG. 7 are similar to steps 101 to 104 of the program 100 in FIG. 3 and, therefore, are not described again. At step 305, it is determined whether the moving distance (x−x0) of the roller 46 is in the range of not smaller than 0 but smaller than D/6 (0≦x−x0<D/6) or in the range of not smaller than 5D/6 and not larger than 2D (5D/6≦x−x0≦2D). In the case where the moving distance (x−x0) of the roller 46 is in any of these predetermined ranges, the process proceeds to step 307, at which the product of the coefficient D/D0 and the predetermined pressing force F0 is multiplied by a predetermined coefficient A1 (0<A1<1) thereby to calculate the target pressing force F(x) (FIG. 8a). The simultaneous determination of the two different ranges (0≦x−x0<D/6, 5D/6≦x−x0≦2D) is due to the symmetry of the wafer 20.

In the case where the moving distance (x−x0) is not in any of the predetermined ranges at step 305, the process proceeds to step 306. At step 306, it is determined whether the moving distance (x−x0) of the roller 46 is in the range of not less than D/6 but smaller than 2D/6 (D/6≦x−x0<2D/6) or in the range of not less than 4D/6 but not more than 5D/6 (4D/6≦x−x0≦5D/6). In the case where the covered distance (x−x0) of the roller 46 is in any of these predetermined ranges, the process proceeds to step 308, at which the product of the coefficient D/D0 and the predetermined pressing force F0 is multiplied by a predetermined coefficient A2 (A1<A2<1) thereby to calculate the target pressing force F(x) (FIG. 8a).

Further, in the case where the moving distance (x−x0) is not in any of the predetermined ranges at step 306, the process proceeds to step 309. At step 309, it is considered that the moving distance (x−x0) of the roller 46 is in the range of not less than 2D/6 but smaller than 4D/6 (2D/6≦x−x0<4D/6), and the process proceeds to step 311, at which the product of the coefficient D/D0 and the predetermined pressing force F0 is multiplied by a predetermined coefficient 1.0 thereby to calculate the target pressing force F(x) (FIG. 8a).

The process then proceeds to step 312 to set the pressing force F(x) of the table 31 obtained at each of steps 307, 308, 311. Once the pressing force F(x) is set this way, the pressure P(x) undergoes a change as shown in FIG. 8b described later.

Then, at step 314, it is determined whether the moving distance (x−x0) of the roller 46 calculated at step 304 is larger than the diameter D of the wafer 20 or not. In the case where the moving distance (x−x0) is not larger than the diameter D, i.e. in the case where the moving distance (x−x0) is equal to or smaller than the diameter D, the process proceeds to step 303 to repeat the same operation. In the case where it is determined that the moving distance (x−x0) is larger than the diameter D, on the other hand, the roller 46 is considered to have exceeded the second end 29 of the wafer 20 and therefore the process is ended. After that, the cutter unit 65 is rotated so that the tape 3 adhered on the wafer 20 is cut off appropriately along the periphery of the wafer 20.

Figure 8B:
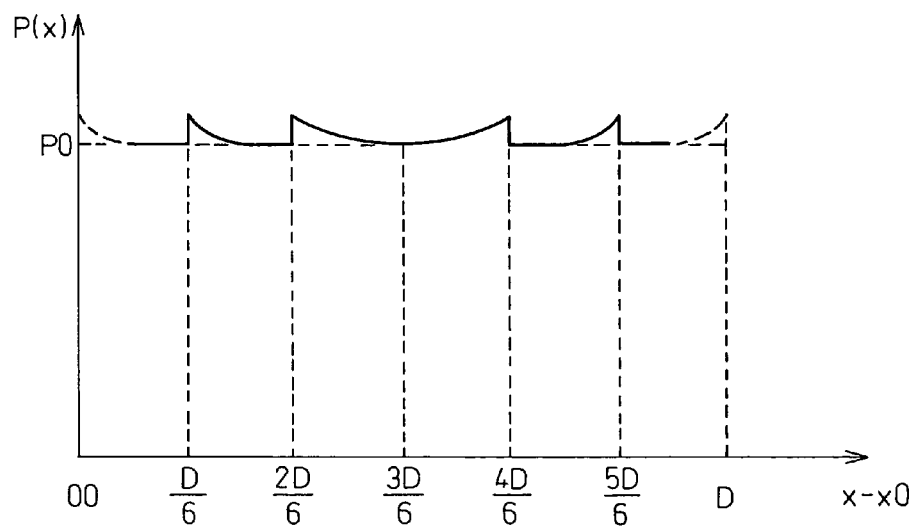
FIG. 8b is a diagram showing the relation between the distance (x−x0) in which the roller moves and the pressure P(x) for the program shown in FIG. 7.
Figure 10A:
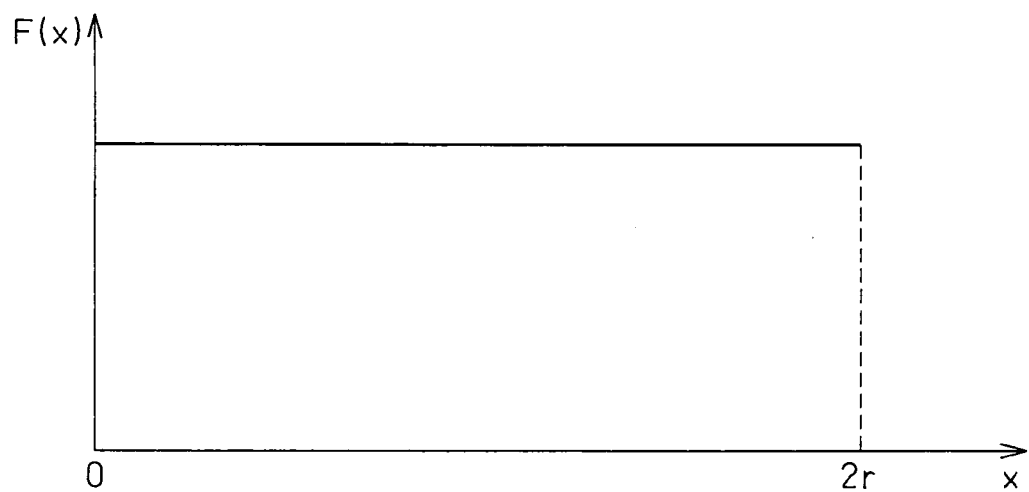
FIG. 10a is a diagram showing the relation between the force exerted between the roller and the adsorption table of an ordinary tape adhering apparatus and the distance from one end of the wafer.
Figure 10B:
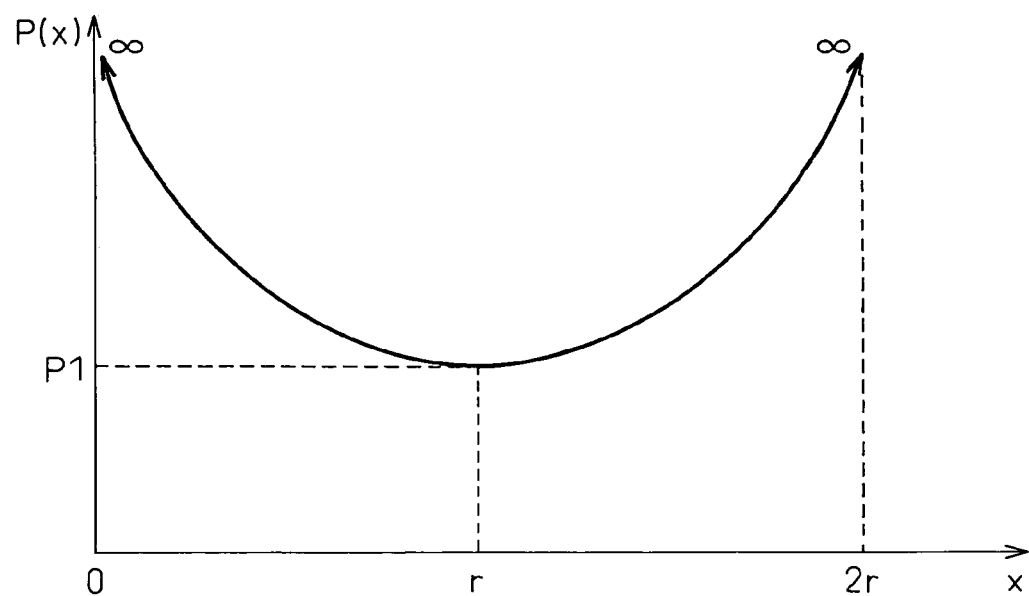
Figure 11A:
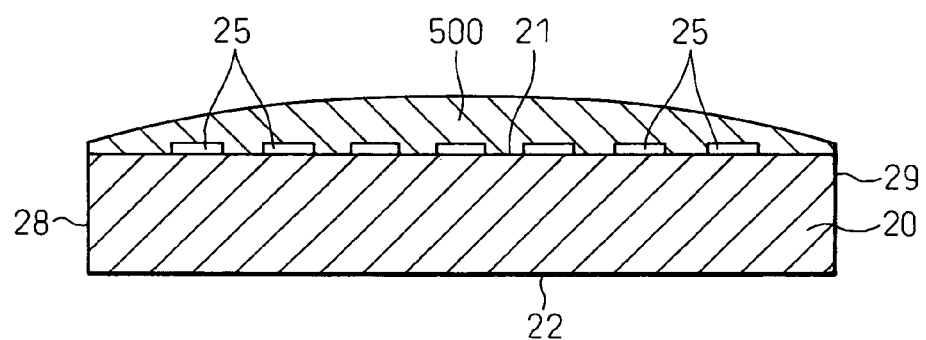
FIG. 11a is a sectional view taken along the direction in which the roller proceeds when the surface protection tape is adhered on the surface of the wafer formed with semiconductor elements by the ordinary tape adhering apparatus.
Figure 11B:
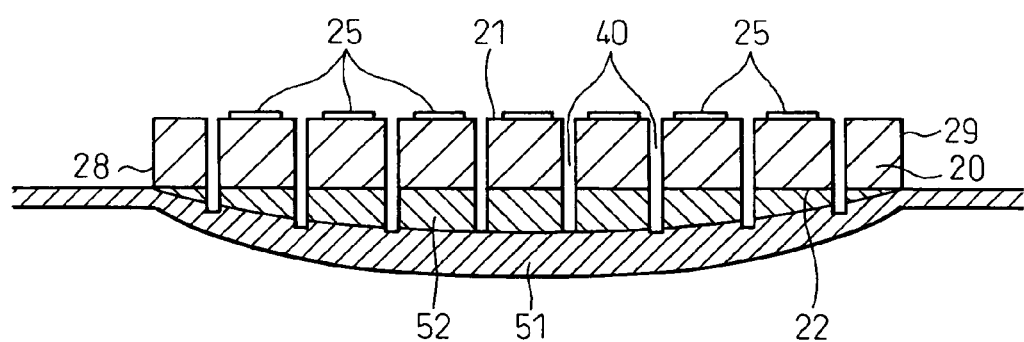
FIG. 11b is a sectional view taken along the direction in which the roller proceeds when the dicing tape is adhered on the reverse surface of the wafer by the ordinary tape adhering apparatus.

In the case where the target pressing force F(x) is changed upward in steps at the central portion of the wafer 20 as shown in FIG. 8a, the pressure P(x) at each zone changes as shown in FIG. 8b. In the prior art shown in FIG. 10b, the pressure P(x) tends to decrease at the central portion of the wafer 20. In the case where the target pressing force F(x) is changed in steps as shown in FIG. 8a, however, the difference can be comparatively reduced, for example between the pressure P(x) for the moving distance (x−x0) of D/6 and the pressure P(x) for the moving distance (x−x0) of 3D/6. For this reason, in the case shown in FIG. 8b, the pressure P applied to the wafer 20 is considered substantially equalized over the whole wafer 20 as compared with the prior art. Even in this case, therefore, the tape 3 can be adhered in comparatively uniform fashion, and the same effects as described above can be produced. Further, according to the embodiment described with reference to FIGS. 7 and 8, the target pressing force F(x) can be determined in accordance with the value of the covered distance (x−x0) without calculating the contact width W.

Figure 9:
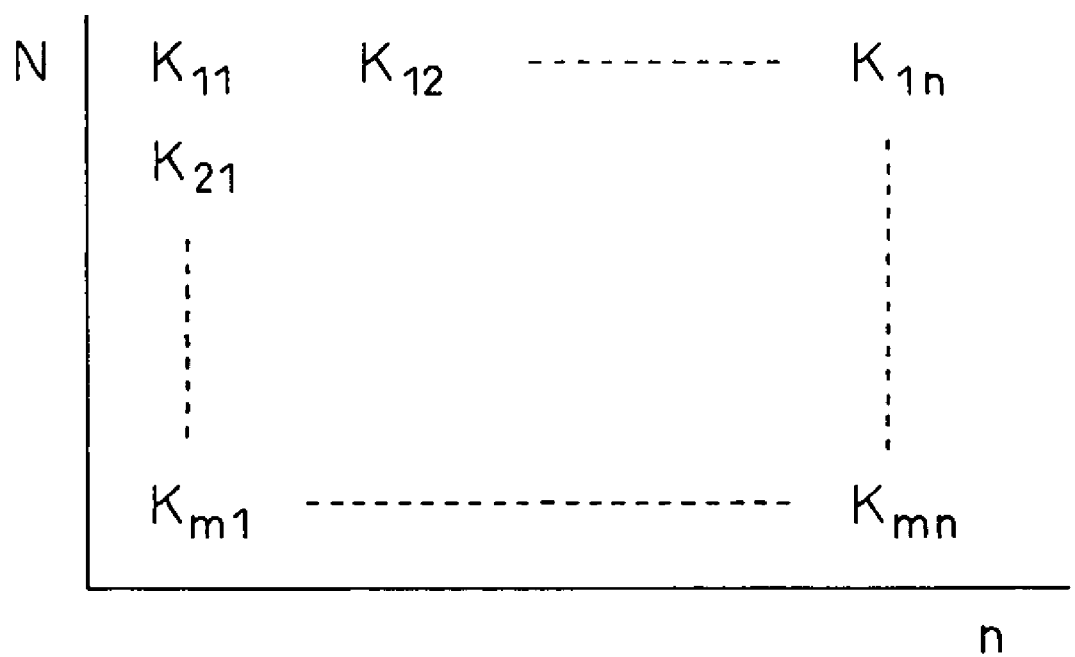
FIG. 9 is a map of the number N into which the wafer is divided and the numeral n corresponding to the distance moved by the roller.

Unlike in FIGS. 7, 8 in which the diameter D of the wafer 20 is divided into six zones, the diameter D may alternatively be divided into other than six zones. In the case where the diameter D is divided into six zones, the predetermined coefficient A1 is used at step 307, the predetermined coefficient A2 at step 308 and the predetermined coefficient 1.0 at step 311. In the case where the diameter D is divided in other than six zones, however, it is apparent that different coefficients are used and the number of steps in the flowchart is different. In the case where the diameter D of the wafer 20 is divided into N zones, for example, the coefficients corresponding to those used at step 307, etc. are determined in accordance with the numeral n indicating a particular zone, of all the N areas, associated with the moving distance (x−x0) as counted from the first end 28 of the wafer 20. In such a case, the coefficient K used at the steps corresponding to steps 307, etc. is determined experimentally in advance in the form of a map as a function of the number N of the zones and the numeral n indicating the number of a particular zone associated with the moving distance (x−x0) as counted from the first end 28 of the wafer 20 of all the N areas (FIG. 9). This map is stored in the memory of the control unit 80 in advance, and used at any time as required. At a step (not shown) corresponding to step 307, etc., the coefficient K determined from the number N of the zones and the numeral n indicating a particular zone counted from the first end 28 is multiplied thereby to calculate the pressing force F(x). Also in this case, it is apparent that the same effects as in the embodiment described above with reference to FIGS. 7 and 8 are produced.

In the embodiment shown in FIGS. 1 and 2, the table 31 supporting the wafer 20 and the tape adhering surface 20' of the wafer 20 supported on the table 31 face upward. By turning the whole arrangement of FIG. 2 upside down, however, the table 31 and the tape adhering surface 20' of the wafer 20 may face downward. In this case, the roller 46 is located under the tape adhering surface of the wafer 20 supported on the table 31, and the tape 3 is supplied between the roller 46 and the wafer 20. According to this invention, the tape 3 may be the surface protection tape adhered at the time of back grinding or the dicing tape adhered at the time of dicing. After adhering any of these tapes, therefore, the wafer on which the tape is adhered is required to be inverted in position for back grinding or dicing, as the case may be. For this purpose, an inversion table is normally used. In the case where the table 31, etc. is turned upside down as described above, however, the tape adhering surface 20' is located underneath, and therefore the wafer is not required to be inverted in position after adhering the tape. In this case, the wafer with the tape adhered thereon can be conveyed as it is to the subsequent process of back grinding or dicing without using any inversion table.

As another alternative, the table 31 and the roller 46 may be arranged at a position turned by 90 degrees from the position shown in FIG. 2 so that the wafer 20 supported on the table 31 is positioned in parallel to the vertical direction. Also in this case, the same effects as those of the embodiments described above can be obtained without taking the effect of the weight of the roller 46 and the table 31 into consideration. The embodiments described above can of course be combined with equal effect according to the invention.

While the invention has been described by reference to specific embodiments chosen for purposes of illustration, it should be apparent that numerous modifications could be made thereto by those skilled in the art without departing from the basic concept and scope of the invention.

The invention claimed is:

1. A tape adhering apparatus for adhering a tape on a wafer, comprising:
   a movable table, for supporting the wafer, movable in a direction at right angle to a tape adhering surface of the wafer, the movable table being capable of applying a pressing force against the wafer;
   a tape adhering means adapted to move from a first end to a second end of the wafer in parallel to the tape adhering surface to adhere the tape on the wafer; and
   a tape supply means for supplying the tape between the tape adhering surface of the wafer and the tape adhering means,
   wherein the movable table is advanced toward and retreated from the tape adhering means in the direction at right angle to the tape adhering means so that the tape adhering surface of the wafer on the movable table is pressed with the pressing force against the tape adhering means via the tape;
   a tape adhering means moving distance calculation means for detecting a distance in which the tape adhering means moves from a first end of the wafer when the tape adhering means moves from the first end to a second end of the wafer in parallel to the tape adhering surface of the wafer; and
   a movable table pressing force setting means for setting the pressing force of the movable table using the distance in which the tape adhering means moves detected by the tape adhering means moving distance calculation means in such a manner that a pressure of a contact portion of the wafer is kept substantially constant when the tape adhering means moves from the first end to the second end of the wafer.

2. A tape adhering apparatus according to claim 1, further comprising a contact area calculation means for calculating, from the distance in which the tape adhering means moves, a contact area based on a width of the contact portion of the wafer when the tape adhering means moves from the first end to the second end of the wafer in parallel to the tape adhering surface of the wafer;
   wherein the movable table pressing force setting means sets the pressing force of the movable table in such a manner that the pressing force proportional to the contact area calculated by the contact area calculation means is applied to the wafer.

3. A tape adhering apparatus according to claim 1,
   wherein the surface of the wafer is divided into a plurality of zones, and the pressing force of the movable table is set by the movable table pressing force setting means in such a manner that the pressing force depending on the corresponding one of the zones based on the distance of the tape adhering means calculated by the tape adhering means moving distance calculation means is applied to the wafer.

4. A tape adhering apparatus according to claim 1, wherein the pressing force of the movable table is set using the size of the wafer.

5. A tape adhering apparatus according to claim 1,
   further comprising a fixed table arranged around the movable table to support an auxiliary adhering member,
   wherein the tape adhering means adheres the tape to both the auxiliary adhering member and the wafer.

6. A tape adhering apparatus according to claim 1,
   wherein the tape adhering surface of the wafer supported on the table faces downward, and the table is located above the tape supplied from the tape supply means and the tape adhering means.

7. A tape adhering apparatus according to claim 1, wherein the tape adhering surface of the wafer supported on the table is parallel to the vertical direction.

8. A method of adhering a tape on a wafer, comprising the steps of:

supporting a wafer on a movable table adapted to move in a direction at right angle to the tape adhering surface of the wafer on which the tape is adhered and adapted to apply a pressing force against the wafer;

supplying the tape between the tape adhering surface of the wafer and the tape adhering means by the tape supply means;

moving the table toward the tape adhering means and thereby pressing the tape adhering surface of the wafer on the table, with the pressing force, against the tape adhering means via the tape;

moving the tape adhering means from a first end of the wafer in parallel to the tape adhering surface of the wafer;

detecting the distance in which the tape adhering means moves from the first end of the wafer;

calculating, from the distance in which the tape adhering means moves, a contact area of a contact portion of the wafer when the tape adhering means moves from the first end to a second end of the wafer in parallel to the tape adhering surface of the wafer; and setting the pressing force of the movable table using the distance in which the tape adhering means moves, in such a manner that the pressure at the contact portion of the wafer is kept constant when the tape adhering means moves from the first end to the second end of the wafer.

* * * * *